United States Patent [19]

Lipson et al.

[11] 3,953,214

[45] Apr. 27, 1976

[54] PHOTOPOLYMERIZABLE SCREEN PRINTING INKS AND USE THEREOF

[75] Inventors: Melvin A. Lipson, Fullerton; Dale W. Knoth, Norwalk, both of Calif.

[73] Assignee: Dynachem Corporation, Santa Fe Springs, Calif.

[22] Filed: May 24, 1974

[21] Appl. No.: 473,236

[52] U.S. Cl. ................................. 96/115 P; 96/35.1
[51] Int. Cl.$^2$ ........................ G03C 1/68; G03C 5/00
[58] Field of Search ............... 96/115 P, 115 R, 35.1

[56] References Cited
UNITED STATES PATENTS

| | | | |
|---|---|---|---|
| 2,791,504 | 5/1957 | Plambeck | 96/115 P |
| 3,255,006 | 6/1966 | Bailey | 96/115 P |
| 3,695,877 | 10/1972 | Taneda et al. | 96/115 P |
| 3,753,720 | 8/1973 | Kloczewski et al. | 96/35.1 |

*Primary Examiner*—David Klein
*Assistant Examiner*—Louis Falasco
*Attorney, Agent, or Firm*—Bert J. Lewen

[57] ABSTRACT

Photopolymerizable screen printing inks comprising a hydroxyalkyl acrylate-type monomeric material, a polyester binder and a free-radical initiating system, such inks having a viscosity of from 5,000 to 200,000 centipoises, an acid number of from 0 to 120 and a thixotropic index of from 1 to 4. The process of using such inks to treat substrates, such as in making printed circuits, which includes the steps of screen printing the photopolymerizable ink on the substrate; exposing the ink to actinic radiation to cure the ink and to form a resist; and permanently modifying the exposed areas on the substrate. The resist may thereafter be removed by dissolving in aqueous dilute alkali or an organic solvent.

7 Claims, No Drawings

PHOTOPOLYMERIZABLE SCREEN PRINTING INKS AND USE THEREOF

This invention relates to a new and improved process for preparing printed circuits and improved photopolymerizable screen printing inks useful therefor. More specifically, the invention teaches the use of photopolymerizable inks for use in forming strippable resists on substrates such as printed circuit boards.

In fabricating printed circuits, several major processing steps are involved. These include etching, electroplating and electroless plating. Such processing steps are conventionally performed by means of developable photo-resists as shown, for example, in U.S. Pat. 3,469,982 to Celeste. Briefly stated, such process calls for coating a copper clad fiberglass board with a photopolymerizable film, exposing the film, imagewise, to actinic radiation, washing away the unexposed area and leaving on the board the photo-resist image. Thereafter, the exposed area is modified as desired, as for example by an etchant. The resist may be removed by means of a solvent with the aid of mechanical action.

The aforesaid process suffers from many disadvantages. Firstly, in forming the photopolymerizable film it is necessary to dry the organic solvent. Drying, whether done by the manufacturer as in the case of the dry film or by the fabricator of the printed circuits using a liquid photo-polymerizable composition, is time-consuming and the solvent vapors pollute the atmosphere. Secondly, the exposed photo-resist must be developed. This again is time-consuming and costly because of the need to use and recover solvents, again a source of atmospheric pollution. Finally, it is difficult to strip these photo-resists, a step often necessary before further processing is possible.

In accordance with the invention, it has now been discovered that the aforesaid disadvantages can be overcome by using the screen printable photopolymerizable compositions of the invention, hereinafter referred to as "inks," in a process which also forms an embodiment of this invention.

Silk screen printing has been used commercially for over 60 years. Basically, the technique involves squeezing ink through the open meshes of a stretched piece of fabric, originally made of silk, onto a printable substrate. In order to form the pattern on the surface, the screen is imaged, i.e., covered or blocked out in part, by a masking material. The masking material may simply be a stencil or a dried lacquer, shellac or glue. Once the screen has been imaged, it is held taut on a frame and positioned over the substrate. Ink is poured onto the screen and squeezed through the open areas with a rubber-bladed squeegee. Thereafter, the frame is removed and the printed substrate dried.

Conventional screen printing inks are not useful in the practice of the invention. These contain from 40 to 50% of solvent, a wholly negative factor. On the one hand, during the printing process, the loss of solvent must be avoided because it leads to a drastic increase in viscosity and a clogging of the pores on the screen. On the other hand, once the ink is applied to the substrate, much energy and time are required for drying. Thus, the compounder is faced with the dilemma of seeking a solvent system which does not dry before application but which readily dries therafter. Still other problems are caused by the presence of solvents, namely, odor, toxicity, flammability, explosivity, solubility, cost and availability. These problems are aggravated now by government regulations imposing severe limitations on the exhausting of solvents into the atmosphere. Additionally, because of the cost of the solvents, expensive recovery equipment is required.

Because of the aforesaid disadvantages of the presence of a solvent in inks generally, it has been proposed in U.S. Pat. Nos. 3,673,135 and 3,510,340 to Blake to use polymerizable compositions as printing inks. Such polymerizable materials are free of solvents and need only be cured to harden. Unfortunately, such compositions as described in the aforesaid patents have not found application for etching and plating printed circuits because such compositions are not useful for screen printing, nor are the resists formed therefrom readily strippable. Furthermore, to polymerize the inks used by Blake it is necessary to contact the printing ink with catalyst in a separate process step. Not only does this step complicate the process, but, because the catalyst must be dissolved, solvent drying and recovery are necessary.

The process of the invention may be outlined as follows:

1. Screen printing on the surface of a substrate a liquid photopolymerizable ink, thereby leaving on the surface of said substrate an imaged photopolymerizable film at least 0.01 mm. thick.
2. Exposing the photopolymerizable film on said substrate to actinic radiation to form a resist thereon.
3. Permanently modifying the adjacent areas on the substrate which are unprotected by the resist image by etching said areas or depositing material thereon.
4. Stripping the resist from the surface of the substrate.

This method overcomes the disadvantages of Celeste noted above, as well as others. In the practice of Celeste, the entire surface of the substrate is coated with photopolymerizable material. After exposure, the resist is developed by treating with a solvent to dissolve the unexposed portion. This is wasteful of the photopolymerizable composition and is particularly disadvantageous where the substrate is treated prior to coating with the photopolymerizable material. For example, in the case of electroless plating, it is necessary to activate the substrate prior to treatment in the electroless copper solution; otherwise, the resist, itself a polymer, could be activated.

This activation may be adversely affected by, firstly, the heat necessitated by the lamination of the photopolymerizable layer and, secondly, by contact with the developer solvent. In contrast, in performing the method of the instant invention, the photopolymerizable layer is applied only at selected portions of the substrate. No material is wasted. The screen printing operation takes place at room temperature and there is no contact whatever with those portions of the substrate to be treated. Secondly, because none of the photopolymerizable material remains uncured, no development is required. Hence, this second source of possible damage to the pretreated substrate is avoided.

The screen-printable photopolymerizable inks of the invention comprise the following essential components:

1. A liquid addition polymerizable material containing an hydroxyalkyl acrylate as hereinafter defined;
2. Pre-formed polyester polymeric binding agent; and
3. A free-radical generating addition-polymerizing initiating system.

A particular advantage of using the compositions of the invention in contrast to the volatile solvent-containing screen printing inks of the prior art is that the inks are 100% solids (non-volatiles) before curing. Finer mesh sizes, therefore, can be used to get heavy coatings, thereby increasing the resolution capability. Reliable work with lines and spaces below 10 mils is possible. Additionally, because the inks can be left on the screen indefinitely without any hardening or thickening, it is unnecessary to clean up the screens during short periods of inactivity. Also, time and energy are saved because curing of the material can be accomplished in exposure times of less than 5 seconds. Elimination of the drying time saves up to 90% of the electrical energy, since ultra-violet curing replaces the infrared drying.

It is particularly surprising that the resists formed by the subject invention can be stripped under comparatively mild conditions, while at the same time withstanding the acidic and alkaline solutions necessary for etching and electroplating. While the durability of the resists varies in accordance with the formulation selected, the alkaline resists which are preferred in accordance with the invention will remain unaffected by treatment in an alkaline copper pyrophosphate plating bth for 60 minutes at a temperature of 55°C. Similarly, certain formulations of the invention can tolerate the acidity of a copper sulfate electroplating bath having a pH of 0.2 for a period of 30 minutes at 25° C. This balance of properties with a screen printable material had heretofore not been achieved.

Ease of removal is particularly important, since processing with corrosive materials may adversely affect the substrate and is generally more costly and more hazardous to perform.

Where it is desirable to strip the substrate with a dilute alkaline solution, the acid number of the initial ink should be from 35 to 75. This acid number may be achieved either by controlling the polymerization in the formation of the polyester binder or by adding extraneous carboxylic acids such as is hereinafter described. The alkali-strippable resists of the invention are soluble in a solution of 3% of sodium hydroxide at a temperature of 60° C. in less than 2 minutes. The organic-strippable resists dissolve in methylene chloride in less than 1 minute at a temperature of 25° C.

In the practice of the instant invention, the photopolymerizable compositions contain the following proportions of the essential components:

TABLE A

| Component | Broadly % by Wt. | Preferably % by Wt. |
| --- | --- | --- |
| Monomer | 25–50 | 35–40 |
| Polyester Binder | 20–60 | 30–45 |
| Initiator | 5–10 | 6–7 |

The polymerizable material of the invention contains at least 20 weight percent of a hydroxyalkyl acrylate as defined by the formula $CH_2=CR-CO-(C_nH_{2n})OH$, wherein R is hydrogen or methyl and n is 2 or 3. This general formula includes the monomers hydroxyethyl methacrylate, hydroxyethel acrylate, hydroxypropyl methacrylate and hydroxypropyl acrylate. The acrylates are more photoactive, but the methacrylates are advantageous in that they are less toxic. The aforesaid materials are particularly useful in forming the photopolymerizable screen printing inks of the invention since they have the requisite non-volatility and polymer solvency.

The amount of the hydroxyalkyl acrylate in the polymerizable material depends on the ultimate application. For example, where the resist is to be used in conventional acidic etching and plating baths, the hydroxyalkyl acrylate concentration may be from 75 to 100% of the polymerizable material. On the other hand, where general purpose applications are desired, including alkaline etching and plating, it is desirable to include polyfunctional monomers, in which case the amount of the hydroxyalkyl acrylate is preferably from 35 to 85% of the polymerizable material. In addition to the hydroxyalkyl acrylate, small amounts of other mono-functional monomers may also be added.

The preformed polyester binding agent must be soluble or dispersible in the polymerizable monomers. Without this ability, it would be essentially impossible to develop an ink suitable for screen printing. These polyester binding agents are a reaction product of a polycarboxylic acid and a polyhydric alcohol. The polycarboxylic acids may be either saturated or unsaturated. The preferred materials are adipic acid, maleic acid, phthalic acid or their corresponding anhydrides. Other polycarboxylic acids include fumaric acid, aconitic acid, mesaconic acid, citraconic acid, itaconic acid and the halo and alkyl derivatives of the aforesaid acids. Here, too, the anhydrides where they exist may be used. Saturated dicarboxylic acids, such as succinic acid, adipic acid, suberic acid, azelaic acid, sebacic acid; aromatic dicarboxylic acids, such as phthalic acid, isophthalic acid, terephthalic acid, and tetrachlorophthalic acid; and polycarboxylic acids, such as trimellitic acid, are useful.

The polyhydric alcohols which may be used in preparing the polyesters include ethylene glycol, diethylene glycol, triethylene glycol, polyethylene glycol, propylene glycol, dipropylene glycol, polypropylene glycol, glycerol, neopentyl glycol, pentaerythritol, trimethylol propane, trimethylol ethane, and butanediol.

The preferred polyols have a molecular weight of less than about 2,000 and consist essentially of carbon, hydrogen and oxygen. The polyhydric alcohols are generally employed in an equimolar ratio to the acid components, or at slight excess, as, for example, about 5 mol. % excess. Where a more durable resist is sought, it is advantageous to use at least some tri- to tetrafunctional polyol. The appropriate proportion and the selection of such materials may be readily determined by those skilled in the art.

A wide variety of polyfunctional materials may be added as part of the polymerizable material. Preferred materials are 1,6-hexanediol diacrylate, trimethylol propane triacrylate, pentaerythritol triacrylate and tetraacrylate, and bis-2,2-[4-(beta-hydroxyethyl)-phenyl]-propane diacrylate and dimethacrylate. Other materials include unsaturated esters of polyols, particularly such esters of the methylene carboxylic acids, e.g., ethylene diacrylate; diethylene glycol diacrylate; glycerol diacrylate; glycerol triacrylate; ethylene dimethacrylate; 1,3-propylene dimethacrylate; 1,2,4-butanetriol trimethacrylate; 1,4-benzene-diol dimethacrylate; pentaerythritol tetramethacrylate; 1,3-propanediol diacrylate; 1,5-pentanediol dimethacrylate; the bis-acrylates and methacrylates of polyethylene glycols of molecular weight 200–500; unsaturated amides, particularly those of the methylene carboxylic acids, and especially those of alpha,omega-diamines and oxygen-interrupted omega-diamines, such as methylene bis-acrylamide; methylene bis-methacrylamide; 1,6-hexamethylene bis-acrylamide; diethylene triamine tris-methacrylamide; bis-(methacrylamidopropoxy) ethane; bis-methacrylamidoethyl methacrylate N-[(beta-hydroxyethyl-oxy)ethyl] acrylamide; vinyl esters such as divinyl succinate, divinyl adipate, divinyl phthalate, divinyl terephthalate, divinyl benzene-1,3-disulfonate, and divinyl butane-1,4-disulfonate; and unsaturated aldehydes such as sorbaldehyde (hexadienal).

The photo initiators used in the compositions are preferably those activatable by actinic light and thermally inactive at 185° C. and below.

The most preferred initiators are the acyloin ethers such as the benzoin ethers, particularly benzoin isobutyl ether. Such materials are not only easily blended in the monomer solution but they also are inexpensive and act as plasticizers. Other initiators which may be used include the substituted or unsubstituted polynuclear quinones, such as 9,10-anthraquinone; 1-chloroanthraquinone, 2-chloroanthraquinone, 2-methylanthraquinone; 2-ethylanthraquinone; 2-tert-butylanthraquinone; octamethylanthraquinone; 1,4-naphthoquinone; 9,10-phenanthraquinone; 1,2-benzanthraquinone; 2,3-benzanthraquinone; 2-methyl-1,4-naphoquinone; 2,3-dichloronaphthoquinone; 1,4-dimethylanthraquinone; 2,3-dimethylanthraquinone; 2-phenylanthraquinone; 2,3-diphenylanthraquinone; sodium salt of anthraquinone alpha-sulfonic acid; 3-chloro-2-methylanthraquinone; retenequinone; 7,8,9,10-tetrahydronaphthacenequinone; 1,2,3,4-tetrahydrobenz(a)anthracene-7,12-dione.

The following photoinitiators, described in U.S. Pat. 2,760,863, some of which may be thermally active at temperatures as low as 85° C., are also useful: vicinal ketaldonyl compounds, such as diacetyl and benzil; alphaketaldonyl alcohols, such as benzoin and pivaloin; alphahydrocarbon substituted aromatic acyloins; alpha-methylbenzoin; alpha-allylbenzoin; and alpha-phenylbenzoin.

Silver persulfate is also useful as a free-radical generating initiator activatable by actinic radiation. Certain aromatic ketones, e.g., benzophenone and 4,4'-bis-dialkylaminobenzophenones, are also useful.

Table B shows other components which may be added to achieve desired properties for the screen printing inks and the resist formed therefrom. The selection of the materials and the amounts employed may be readily determined by those skilled in the art based on the following ranges:

TABLE B

| Component | Broadly % by Wt. | Preferably % by Wt. |
|---|---|---|
| Inhibitor | 0.01–1.0 | 0.05 |
| Carboxylic Acid | 2–10 | 4–6 |
| Filler | 10–30 | 20 |
| Thixotropic Agent | 0.1–2 | 1.0 |
| Leveling Agent | 1–5 | 2.5 |
| Colorant | 0.1–2 | 1.0 |

Thermal polymerization inhibitors are generally also present in the preferred compositions. These materials act as antioxidants and stabilizers and include p-methoxyphenol, hydroquinone, and alkyl and aryl-substituted hydroquinones and quinones, tert-butyl catechol, pyrogallol, copper resinate, naphthylamines, beta-naphthol, cuprous chloride, 2,6-di-tert-butyl p-cresol, 2,2-methylenebis(4-ethyl-6-t-butylphenol), phenothiazine, pyridine, nitrobenzene, dinitrobenzene, p-toluquinone, chloranil, aryl phosphites, and aryl alkyl phosphites.

In order to obtain a useful screen printing ink, it is essential that the composition of the invention have the appropriate viscosity and thixotropic properties. While usable compositions may be obtained by the selection of the polymerizable material and the binding agents in the relative amounts thereof employed, it is generally desirable to add thixotropic agents, leveling agents and defoamers to achieve a viscosity of from 10,000 to 200,000 centipoises, and a thixotropic index of from 1.00 to 4.00.

The thixotropic agents which may be used are well known to those skilled in the art. Examples of these materials are Bentone (a trademark of National Lead Company for an organic base salt of a clay mineral (e.g., montmorillonite) and other silicate-type materials. Other thixotropic agents are the aluminum, calcium, and zinc salts of fatty acids, such as lauric or stearic acid, e.g., Zinc Soap No. 26 (trademark of the Witco Chemical Co. Inc.); and fumed silicas such as Cab-o-Sil and Santocel (trademarks of the Cabot Corporation and Monsanto Corporation, respectively).

The leveling agents and defoamers which may be used include Modaflow and Multiflow. These are trademarks of the Monsanto Company for resin modifiers. Other leveling and flowout agents include aluminum stearate, calcium stearate, sucrose benzoate, and high molecular weight non-ionic surface active agents.

Additionally, carboxylic acids may be added to the composition to enhance the alkaline strippability of the resist. Such carboxylic acids include, most preferably, itaconic acid and oleic acid, though other carboxylic acids containing from 2 to 36 carbon atoms may also be added. The amount of such acid is determined by the desired acid number of the overall composition. Broadly, as more specifically described in Table B, up to 10 parts by weight based on 100 parts of the ink may be added. This, again, is determined by the ultimate use of the resist formed from the photopolymerizable material. The long chain carboxylic acids are particularly useful since they also serve to act as plasticizers for the resist.

In general, it has been found that the acid number of the ink should be from about 35 to 75 to have a good balance of resistance and ease of strippability. The proper acid number is achieved by selecting a sufficiently acidic polyester binder or by including in the formulation an appropriate amount of carboxylic acid. The polyesters generally used have an acid number of from 60 to 90.

Other ingredients may also be added to the inks of the invention. These include plasticizers, pigments or colorants, fillers, and antioxidants. Those skilled in the art may readily determine the amount of such materials desirable.

In practicing the process of the invention, any of the well known screen printing techniques may be employed. The photopolymerizable ink is applied by pouring a measured quantity on the screen. The squeegee is drawn uniformly and with even pressure to scrape the ink across the entire surface of the screen, thereby transferring the ink to the substrate below. Thereafter, the screen is lifted and the substrate removed. Film thicknesses ranging from 0.006 mm. to 0.130 mm. are applied by this procedure. Film thickness can be measured by such means as micrometer or beta-ray backscattering.

After the print is completed, the screen is lifted and the wet substrate removed and passed to the ultraviolet radiation source. Such sources include carbon arcs, mercury vapor lamps, fluorescent lamps with ultraviolet radiation-emitting phosphors, argon glow lamps, electronic flash units and photographic flood lamps. Of these, the medium pressure mercury vapor lamps are the most suitable. The period of exposure, as will be readily understood by those skilled in the art, will be dependent on the film thickness, the light intensity, the distance from the light source to the ink and the temperature of the operation. A typical exposure time using a 200 watt per linear inch medium pressure mercury vapor lamp at a distance of 4 inches is about 5 seconds. After the exposure, the ink is completely cured and may be passed directly to the next processing step to modify the unexposed portion of the substrate.

In most printed circuit applications, the substrate is a metal-clad plastic. While the metal is generally copper, other metals may also be used, such as magnesium, zinc, nickel, aluminum, steel, steel alloys, and beryllium copper alloys. The plastic board may be any of the type commonly used in the art, such as an epoxy-fiberglass or a fiberglass impregnated polyester. It may be clad with the copper by any of the methods conventionally employed by those skilled in the art. The modification of the unexposed portion of the substrate may be done mechanically or chemically. In the case of etching, mechanical means such as brushing or sand-blasting can be used to remove the metallic film completely or to produce a grained or abraded finish.

Chemical etching of metals is well known to those skilled in the art. The particular etchant used is, of course, dependent on the surface to be treated. In the case of a copper surface, ferric chloride, copper chloride, ammonium persulfate, chromic-sulfuric acid or ammoniacal oxidizing solutions may be used. The aforesaid etching solutions may be either acidic or alkaline.

Where it is desirable to electroplate the exposed portion of the substrate, the acid and alkaline baths well known to those skilled in the art may be used. The resists formed in accordance with the practice of the invention, by selecting the appropriate polymerizable materials and polyester binder as described above, will not be adversely affected by the conventional electroplating baths.

Certain of the resists of the invention may also be used in conjunction with electroless plating such as described in U.S. Pat. Nos. 3,790,392 to Gilano and 3,424,597 to Shipley. The Gilano patent shows a representative alkaline electroless copper plating bath having a pH of 13.3 for use at room temperature. The Shipley patent shows an acidic electroless nickel plating bath having a pH of 4.5 for use at 190° C.

Because of the high alkalinity of some electroless plating baths, it is preferable to use screen printing inks with a high amount of polyfunctional polymerizable material.

After the modification of the unexposed area of the substrate is completed, the resists of the instant invention may be readily removed. Generally, these materials can be removed by treatment in dilute aqueous alkaline solutions. These solutions generally contain from 0.01 to 10% by weight of a water-soluble base. The stripping may be performed by impingement of a spray jet, immersion, or scrubbing.

Suitable bases include water-soluble basic salts such as the carbonates and bicarbonates of alkali and alkaline earth metals. Also, alkaline metal phosphates and pyrophosphates, e.g., trisodium and tripotassium phosphates and sodium and potassium pyrophosphates and organic bases may be used. Stronger bases, of course, can be used to remove the resists of the invention; however, these are usually not necessary. That weak solutions may be used is particularly advantageous, since many of the substrates treated may be adversely affected by such highly alkaline solutions. Accordingly, it is a preferred practice of the invention to remove the coating with an alkaline solution having a pH of from 12 to 13.

In certain instances, the resists of the invention are specially formulated in order to permit ready removal in an organic solvent such as methylene chloride. Other solvents which are generally suitable include trichloroethylene, 1,1,1-trichloroethane, methyl ethyl ketone, monochlorobenzene, ethylene glycol monobutyl ether, dimethylformamide, and N-methylpyrrolidone. Organic solubility is particularly desirable where the substrate is sensitive to alkaline material such as in the case of an aluminum-clad substrate. Other instances where this may be necessary are where the modification of the exposed surface requires a strong alkalinity. The coatings used in these applications are neutral rather than acidic.

To illustrate the invention, several screen printing inks are prepared as described in the following examples. Each of the screen printing inks is applied to a plurality of substrates and cured. The resist formed is subjected to one or more treating baths to modify that portion of the substrate which is left uncovered. The treating procedures employed are described below:

Ferric chloride etchant: The etchant is a 40% aqueous solution of ferric chloride having a pH of less than 0.5. The board is subjected to a recirculating spray of the etchant for a period of 3 to 5 minutes at a temperature of about 50° C.

Alkaline etchant: This etchant, sold under the Southern California Chemical Co. trademark "Alkaline Etchant A System," contains from 100 to 200 grams per liter of cupric chloride, ammonium hydroxide and ammonium chloride and has a pH of from 8.1 to 8.5. The board is subjected to a recirculating spray of this etchant for from 3 to 5 minutes at a temperature of about 55° C. Use of such etchant is further described in U.S. Pat. No. 3,705,061 to King.

Electroless copper plating bath: This bath contains 9.25 grams per liter of copper sulfate, 16 grams per liter of sodium hydroxide, 5 grams per liter of sodium carbonate, 30 grams per liter of 37% formaldehyde and 33 grams per liter of a chelating agent. It has a pH of 13.3. The boards are subjected to immersion in this bath for 10 minutes at 25° C. The use of this bath is further described in U.S. Pat. No. 3,790,392 to Gilano.

Electroless nickel plating bath: This bath contains 20 grams per liter of nickel sulfate, 30 grams per liter of sodium hypophosphite, 28 grams per liter of hydroxyacetic acid and sufficient ammonium hydroxide to adjust the pH to from 4.5 to 5.0. The board is subjected to immersion in this bath for 10 minutes at a temperature of about 90° C. The use of this composition is further described in U.S. Pat. No. 3,424,597 to Shipley.

Copper sulfate electroplating bath: This bath contains 120 grams per liter of copper sulfate, 215 grams per liter of sulfuric acid, and 40 grams per liter of brightener and has a pH of 0.2. The board is subjected to immersion in this bath for 30 minutes at 25° C. with an applied current of 30 amperes per square foot.

Copper-pyrophosphate electroplating bath: This bath contains 22.5 grams per liter of cupric ion, 1.2 grams per liter of ammonia, 175 grams per liter of pyrophosphoric acid, and 1 gram per liter of brighteners. The pH is 8.1 to 8.5. The boards are subjected to immersion in this bath for 45 to 60 minutes at 55° C. with an applied current of 30 amperes per square foot.

Copper fluoborate electroplating bath: This bath contains 56 grams per liter of copper fluoborate and 340 grams per liter of fluoboric acid and has a pH of 0.6. The boards are subjected to immersion in this bath for 30 minutes at 25° C. with an applied current of 30 amperes per square foot.

Tin-lead (60/40) fluoborate electroplating bath: This bath contains 52 grams per liter of stannous ion, 30 grams per liter of lead ion, 100 grams per liter of fluoboric acid, 25 grams per liter of boric acid and 5 grams per liter of peptone. The pH is 0.2. The board is subjected to immersion in this bath for 15 minutes at 25° C. with an applied current of 15 amperes per square foot.

EXAMPLE I

An ink suitable for screen printing which forms a resist which may be used in alkaline and acidic etching and electroplating baths has the following formulation:

TABLE I

| Component | Percent by Weight |
| --- | --- |
| Polymerizable Material (hydroxyethyl methacrylate and trimethylol propane triacrylate in a 1:1 ratio) | 28.4 |
| Polyester Binder (a condensation polymer of propylene glycol and phthalic anhydride having a molecular weight of approximately 3000–5000 and an acid number of 60–90) | 35.2 |
| Itaconic Acid | 2.5 |
| Benzoin Isobutyl Ether | 4.2 |
| Filler (barium sulfate) | 28.5 |
| Leveling Agent (Modaflow) | 0.8 |
| Benzotriazole | 0.08 |
| Phthallo Blue Pigment | 0.15 |

The aforesaid composition has an acid number of 75, a viscosity of 65,000 centipoises, and a thixotropic index of 1.03. A copper-calcd epoxy-fiberglass composite board is placed in fixed contact with a printing screen. The above composition is applied to the screen and spread uniformly thereon with a squeegee in the manner conventionally employed by those skilled in the art. Observation of the application shows that the polymerizable composition covers the surface uniformly, forming a layer about 1 mil in thickness. After the application of the photopolymerizable layer, the screen is removed from the substrate. It is noted that no mesh marks appear on the substrate and the design on the screen is reproduced with excellent integrity.

The screen containing the wet photopolymerizable screen printing ink is exposed for 5 seconds to a 200 watt per linear inch medium pressure mercury vapor lamp at a distance of 4 inches. After the exposure, the printed coating is completely hardened to form a resist.

Boards thus prepared are treated with the ferric chloride etchant, the alkaline etchant, the copper sulfate electroplating bath, the copper pyrophosphate electroplating bath, the copper fluoborate electroplating bath and the tin-lead fluoborate electroplating bath as described above.

After each substrate is removed from the respective bath, the resist is carefully inspected. Inspection shows that the resist is intact and, after rinsing and drying, still substantially similar in appearance to the resist prior to the treating operation. The resist remains hard and free from tack in all cases. Thereafter, the resist is stripped in a 3% solution of sodium hydroxide at a temperature of 55° C. for a period of 2 minutes. The treated area is examined and found to have excellent detail and integrity when compared to the screen printed image.

EXAMPLE II

Another all-purpose resist is prepared having the following formulation:

TABLE II

| Component | Percent by Weight |
| --- | --- |
| Monomer (hydroxyethyl methacrylate and 1,6-hexanediol diacrylate in a weight ratio of 3:1) | 26.1 |
| Polyester Binder (a condensation polymer of propylene glycol and 1:1 maleic and isophthalic acids having a molecular weight of approximately 5000 and an acid number of approximately 10) | 39.1 |
| Benzoin Isobutyl Ether | 5.0 |
| Filler (barium sulfate) | 28.4 |
| Leveling Agent (Modaflow) | 1.2 |
| Benzotriazole | 0.02 |
| Methyl Violet Base | 0.12 |

The above composition has an acid number of 7 to 10, a viscosity of 38,000 centipoises and a thixotropic index of 1.23.

Using the procedure described in Example I, a resist-covered copper-clad epoxy-fiberglass composite board is prepared. Observations show that the application of the screen printing ink covered the surface uniformly and that no mesh marks appeared on the substrate. The design on the screen is produced with integrity. After exposure, the boards thus prepared are treated with the ferric chloride etchant, the alkaline etchant, the copper sulfate electroplating bath, the copper pyrophosphate electroplating bath, the copper fluoborate electroplating and the tin-lead fluoborate electroplating bath as described above.

After each board is removed from the respective baths, the resist is carefully inspected. Inspection shows that the resist is intact. After rinsing and drying, it is still substantially similar in appearance to the resist prior to the treating operation. The resist remains hard and free from tack in all cases. Thereafter, the resist is stripped in methylene chloride at room temperature for a period of 30 seconds. The treated area is examined and found to have excellent detail and integrity when compared to the screen printed image.

EXAMPLE III

A screen-printable photopolymerizable ink useful for acidic etching and electroplating is prepared having the following composition:

TABLE III

| Component | Percent by Weight |
| --- | --- |
| Hydroxyethyl Methacrylate | 34.2 |
| Polyester Binder (same as in Example II) | 51.3 |
| Itaconic Acid | 2.5 |
| Oleic Acid | 2.5 |
| Thixotropic Agent (Bentone 38, an organic salt of a clay mineral, trademark of National Lead Co.) | 1.0 |
| Benzoin Isobutyl Ether | 5.9 |
| Paliofast Green Pigment 9360 (trademark of BASF-Wyandotte Co.) | 1.5 |
| Leveling Agent (Modaflow) | 1.0 |
| 2,5-Diphenyl-1,4-benzoquinone | 0.03 |

The aforesaid photopolymerizable printing ink has an acid number of 52, a viscosity of 28,000 centipoises and a thixotropic index of 1.04.

The printing inks are applied to a series of copper-clad epoxy-fiberglass composite boards and thereafter cured as described in Example I. No mesh marks appear on the substrate and the design on the screen is reproduced with excellent integrity.

Boards thus prepared are treated with the ferric chloride etchant, the copper sulfate electroplating bath, the copper fluoborate electroplating bath, and the tin-lead fluoborate electroplating bath. After each substrate is removed from the respective bath, the resist is carefully inspected. Inspection shows that the resist is intact and, after rinsing and drying, still substantially similar in appearance to the resist prior to the treating operation. The resist remains hard and free from tack in all cases. Thereafter, the resist is stripped as described in Example I. The treated area is examined and found to have excellent detail and integrity when compared to the screen printed image.

EXAMPLE IV

A photopolymerizable ink useful for acidic etchants and easily strippable with mild alkali is prepared having the following composition:

TABLE IV

| Component | Percent by Weight |
| --- | --- |
| Hydroxyethyl Methacrylate | 36.8 |
| Polyester Binder (same as in Example I) | 36.8 |
| Itaconic Acid | 2.15 |
| Oleic Acid | 2.15 |
| Thixotropic Agent (Bentone 38) | 2.94 |
| Benzoin Isobutyl Ether | 6.86 |
| Talc | 9.47 |
| Leveling Agent (Modaflow) | 2.21 |
| Paliofast Red Pigment 3910 (trademark of BASF-Wyandotte Co.) | 0.61 |
| 2,5-Diphenyl-1,4-benzoquinone | 0.02 |
| 4-t-Butyl Catechol | 0.01 |

The aforesaid photopolymerizable composition has an acid number of 64, a viscosity of 34,000 centipoises and a thixotropic index of 2.72.

The above composition was applied as described in Example I to a polyester-fiberglass composite board. Observation shows that the polymerizable composition covers the surface uniformly. After the application of the photopolymerizable ink layer, the screen is removed from the substrate. No mesh marks appear on the substrate and the design on the screen is reproduced with excellent integrity. The screen containing the wet screen printing ink is exposed for 5 seconds to a 200 watts per linear inch medium pressure mercury vapor lamp at a distance of 4 inches. After exposure, the printed coating is completely hardened to form a resist.

The board thus prepared is treated with the ferric chloride etchant as described above. After the board is removed from the etching bath, rinsed and dried, inspection shows that the resist is intact and still similar in appearance to the resist prior to the etching operation. The resist remains hard and free from tack.

Thereafter, the resist is stripped from the etched board in a 2% solution of trisodium phosphate having a pH of about 12.6 at a temperature of 25°C. for a period of 2 minutes. The etched area is examined and found to have excellent detail and integrity. The inexpensive polyester fiberglass composite board is not attacked by this mild alkaline solution. Though this composition is not adequately durable to resist the rigours of the conventional electroplating solutions or alkaline etchants, it is particularly effective with acidic etchants and very easily stripped after use.

EXAMPLE V

This example shows an ink suitable for screen printing which forms a resist which may be used for additive circuitry. It has the following formulation:

TABLE V

| Component | Percent by Weight |
| --- | --- |
| Polyester (same as in Example II) | 39.1 |
| Hydroxyethyl Methacrylate | 13.0 |
| Trimethylolpropane Triacrylate | 13.0 |
| Filler (barium sulfate) | 28.5 |
| Methyl Violet Base | 0.13 |
| Benzotriazole | 0.02 |
| Benzoin Isobutyl Ether | 5.01 |
| Leveling Agent (Modaflow) | 1.25 |

The aforesaid composition has an acid number of 3, a viscosity of 185,000 centipoises, and a thixotropic index of 1.03. An epoxy-fiberglass composite board is palladium-activated with a solution described in U.S. Pat. No. 3,011,920 to Shipley. The sensitized board is screen printed with the above formulation as described in Example I. The photopolymerizable composition covers the surface uniformly and no mesh marks appear on the substrate. The design on the screen is reproduced with excellent integrity. The wet photopolymerizable ink is cured by exposure as described in Example I. After exposure, the printed coating is completely hardened. The board thus prepared is treated sequentially with the electroless copper plating bath, the copper sulfate electroplating bath and the tin-lead fluoborate electroplating bath. After the substrate is removed from the final bath, the resist is carefully inspected. Inspection shows that the resist is intact, and still substantially similar in appearance to the resist prior to the treating operations. The resist remains hard and free from tack in all cases. Thereafter, the resist is stripped with methylene chloride at a temperature of 25°C. for a period of 30 seconds, thereby producing a completed printed circuit board. By using additive circuitry, it is unnecessary to completely cover the composite board with a conductive coating and thereafter dissolve the resist-covered portions. It is most unexpected that a resist which is durable with the variety of electroplating baths described above may be this readily removed by the organic solvent. This screen printing ink contains, in addition to the hydroxyethyl methacrylate, a trifunctional monomer. This trifunctional material provides the resist with outstanding durability with respect to electroless copper plating baths, while not interfering with the solubility of the resist in methylene chloride.

EXAMPLE VI

This example shows another preparation of a finished printed circuit board. The resist formed is soluble in dilute aqueous caustic while at the same time being sufficiently durable to maintain its integrity in the presence of all of the etching and plating baths described above. These baths range in pH from 0.2 to 13.3. The photopolymerizable ink has the following composition:

TABLE VI

| Component | Percent by Weight |
|---|---|
| Polyester (same as in Example I) | 42.6 |
| Hydroxyethyl Methacrylate | 26.6 |
| Bis-2,2-[4-(beta-hydroxyethyl)-phenyl]-propane Diacrylate | 16.0 |
| Itaconic Acid | 3.65 |
| Hecto Blue Dye (BASF) | 0.07 |
| Crystal Violet Dye | 0.11 |
| Benzoin Isobutyl Ether | 7.30 |
| Leveling Agent (Modaflow) | 3.65 |

The above composition has an acid number of 72, a viscosity of 28,000 centipoises, and a thixotropic index of 1.25.

The ink is applied to a copper-clad substrate and cured as described in Example I. The ink covers the surface uniformly and no mesh marks appear on the substrate. The design on the screen is reproduced with excellent integrity. After curing, the resist is completely hardened.

The board thus prepared is subjected sequentially to the copper pyrophosphate electroplating bath and the tin-lead fluoborate electroplating bath. After treatment, the substrate is carefully inspected and the resist is found to be hard and free from tack. Thereafter, the resist is readily stripped with a 3% solution of sodium hydroxide at a temperature of 55° C. for a period of 2 minutes. After the resist is removed, the plated circuit board is treated in the alkaline etchant bath described above. This solution dissolves the copper foil previously covered by the resist, thereby forming a finished printed circuit board. The alkaline etchant does not attack the tin-lead coating.

This screen printing ink contains bis-2,2-[4-(beta-hydroxyethyl)-phenyl]-propane diacrylate. This difunctional material serves to increase the durability of the resist, particularly with respect to the electroless plating baths. Surprisingly, the addition of such difunctional material does not interfere with the solubility in the dilute aqueous caustic.

We claim:

1. A photopolymerizable screen printing ink which comprises:
   A. 25 to 50% by weight of a photopolymerizable monomeric material containing at least 20 weight percent hydroxyalkyl acrylate or methacrylate;
   B. 20 to 60% by weight of a polyester binder having a molecular weight of from 500 to 50,000;
   C. 5 to 10% by weight of a free radical generating addition polymerizing initiating system;
   said photopolymerizable composition having a viscosity of from 5,000 to 200,000 centipoises, an acid number of from 0 to 120, and a thixotropic index of from 1.00 to 4.00.

2. The screen printing ink of claim 1 wherein the photopolymerizable monomeric material consists essentially of a hydroxyalkyl acrylate or methacrylate.

3. The screen printing ink of claim 1 wherein the polyester binder is a condensation product of propylene glycol and phthalic anhydride.

4. The screen printing ink of claim 1 wherein the polyester binder is a condensation product of propylene glycol and a 1 to 1 mixture of maleic and isophthalic acids.

5. The screen printing ink of claim 1 wherein the initiating system contains a benzoin ether.

6. The screen printing ink of claim 1 wherein the ink contains up to ten parts by weight, based on 100 parts of ink, of a carboxylic acid containing from 2 to 36 carbon atoms.

7. The screen printing ink of claim 1 wherein the ink contains a maximum of 50 weight percent of a polyfunctional acrylate or methacrylate as part of the photopolymerizable monomeric material.

* * * * *